United States Patent
Kubo

(10) Patent No.: US 7,679,040 B2
(45) Date of Patent: Mar. 16, 2010

(54) OPTICAL CONTROL DEVICE

(75) Inventor: Isao Kubo, Nagoya (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 19 days.

(21) Appl. No.: 11/782,114

(22) Filed: Jul. 24, 2007

(65) Prior Publication Data

US 2008/0048096 A1 Feb. 28, 2008

(30) Foreign Application Priority Data

Jul. 24, 2006 (JP) ............... 2006-201078

(51) Int. Cl.
*G01J 1/32* (2006.01)
(52) U.S. Cl. ............. 250/205; 250/214 R; 355/68
(58) Field of Classification Search ........... 250/205, 250/214 R, 214 AG, 214 C; 355/67, 68; 369/116
See application file for complete search history.

(56) References Cited

U.S. PATENT DOCUMENTS

2005/0219990 A1* 10/2005 Inukai ............... 369/116

FOREIGN PATENT DOCUMENTS

| JP | 07125305 | 5/1995 |
| JP | 2003127460 | 5/2003 |
| JP | 2004025462 | 1/2004 |

* cited by examiner

*Primary Examiner*—Kevin Pyo
(74) *Attorney, Agent, or Firm*—Banner & Witcoff, Ltd

(57) ABSTRACT

An optical control device includes a semiconductor laser that generates a light according to a drive current, a light amount detecting unit that detects a light amount of the light generated by the semiconductor laser; and a controller that controls the drive current to adjust the light amount to a target value by referring to a referring number of detection results of the light amount by the light amount detecting unit. The referring number at a time when the controller starts the drive current flowing is smaller than the referring number after the detection result of the light amount reaches a predetermined value.

13 Claims, 9 Drawing Sheets

OPTICAL CONTROL DEVICE

CROSS-REFERENCE TO RELATED APPLICATION

This application claims priority from Japanese Patent Application No. 2006-201078, filed on Jul. 24, 2006, the entire subject matter of which is incorporated herein by reference.

TECHNICAL FIELD

Aspects of the present invention relate to an optical control device which controls a drive current of a semiconductor laser to adjust an amount of a laser beam to a target value.

BACKGROUND

There is an optical control device including: a semiconductor laser which generates a laser beam according to a drive current; a light amount detecting unit that detects a light amount of the laser beam generated by the semiconductor laser; and a controller that controls the drive current so as to adjust the light amount to a target value by referring to the light amount detected by the light amount detecting unit. In this type of optical control device, the light amount of a laser beam generated by the semiconductor laser can be adjusted to the target value.

For this type of device, to eliminate droop characteristics and noise of the semiconductor laser, JP-A-7-125305 discloses that every light amounts obtained by unblanking APC in the first line are stored and every values including values obtained by the APC at the beginning are averaged and the average is set as a light amount set value for the second line.

However, if the above-described control according to JP-A-7-125305 is performed when the drive current starts flowing, the light amount change is made less distinct and the time until the light amount reaches the target value becomes long.

An optical control device includes a switching unit that draws the drive currents into an energizing path that does not pass through the semiconductor laser. In the optical control device, even when the semiconductor laser to be turned off, the drive current is made to flow into the semiconductor laser by the switching unit at a time when the semiconductor laser emits light without influence on other devices, in order to detect a light amount to be referred. However, the light amount immediately after the drive current made to flow into the semiconductor laser is unstable due to fluctuation such as overshoot. However, in some cases, it is difficult to continue emitting light from the semiconductor laser until the light amount becomes stable. If the drive current is controlled by referring to the light amount detected in a period in which the light amount is unstable as described above, there is a possibility that the light amount of the laser beam generated from the semiconductor laser cannot be satisfactorily controlled to the target value.

SUMMARY

An aspect of the present invention provides an optical control device includes a semiconductor laser that generates a light according to a drive current, a light amount detecting unit that detects a light amount of the light generated by the semiconductor laser; and a controller that controls the drive current to adjust the light amount to a target value by referring to a referring number of detection results of the light amount by the light amount detecting unit. The referring number at a time when the controller starts the drive current flowing is smaller than the referring number after the detection result of the light amount reaches a predetermined value.

According to the above configuration, by referring to detection results of light amount of the light by the light amount detecting unit, the controller may control the drive current of the semiconductor laser so that the light amount of the light approaches the target value. In addition, the referring number of detection results of the light amount which the controller refers to may be smaller when the controller starts the drive current flowing than the referring number after the light amount reaches the target value. Therefore, control may be performed by referring to detection results of light amount at a smaller number of times when the controller starts the drive current flowing to the semiconductor laser, so that the light amount changes when the drive current starts flowing may be satisfactorily followed, and the light amount may be adjusted quickly to the target value. After the light amount reaches the target value, control may be performed by referring to the detection results of light amount at a larger number of times than at the time when the drive current starts flowing, so that stable control may be performed.

DETAILED DESCRIPTION

Figure 1:
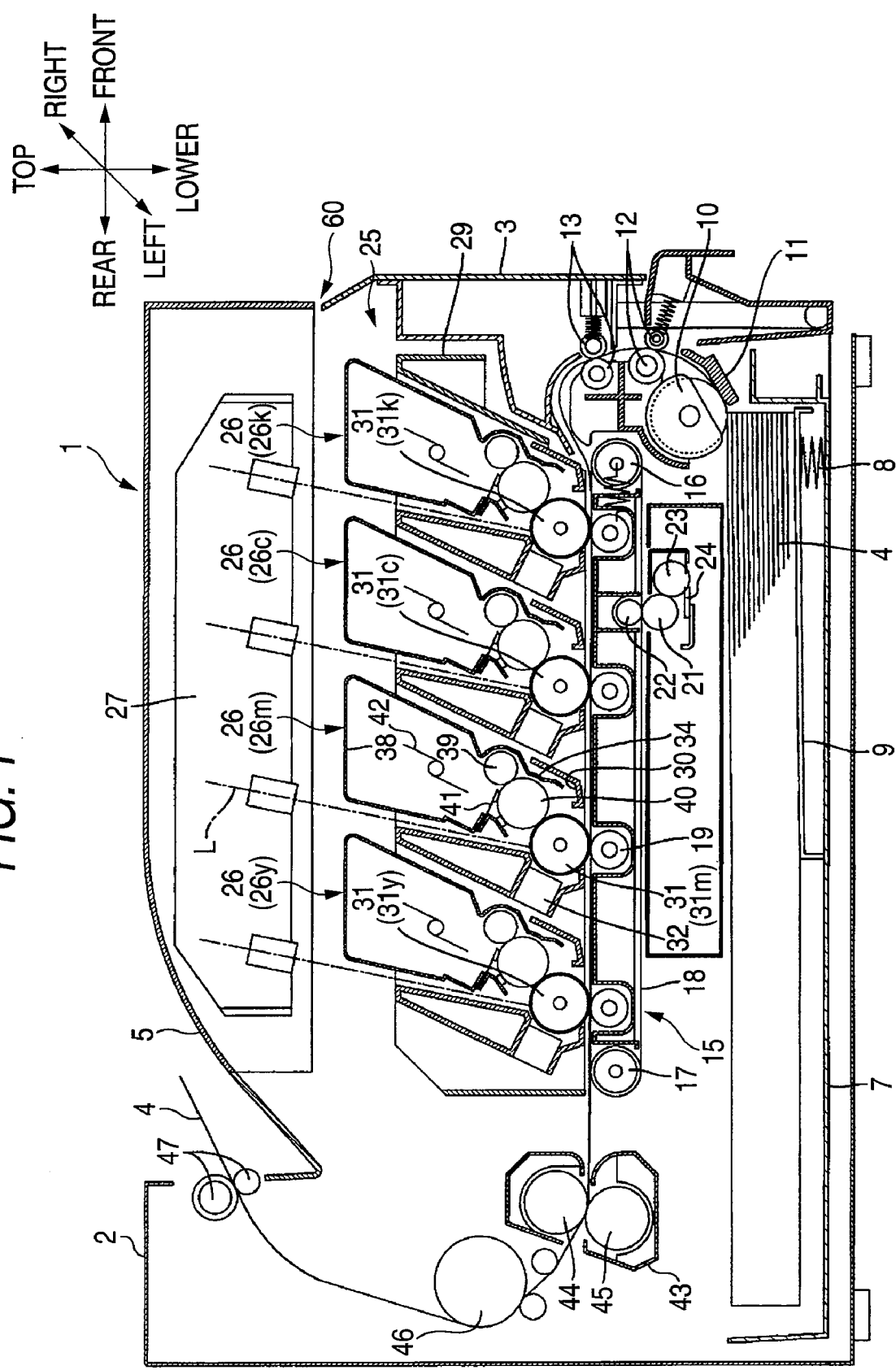
FIG. 1 is a general sectional view showing a configuration of a laser printer according to an embodiment of the present invention.

Embodiments of the present invention will be described with reference to the drawings. FIG. 1 is a side sectional view showing a general configuration of a laser printer 1 serving as an image forming apparatus. In the description given below, the right side of FIG. 1 is defined as the front side.

(Overall Configuration of Laser Printer)

The laser printer 1 is a direct transfer tandem-type color laser printer, and includes a substantially box-shaped main body casing 2 as shown in FIG. 1. The main body casing 2 includes a sheet discharging tray 5 on which a sheet 4 as a recording medium after being formed with images are stacked on the upper surface thereof and a front cover 3 that can be opened and closed and is arranged on the front face thereof. A process unit 25 can be drawn forward out of the main body casing 2 by opening the front cover 3.

To a lower portion of the main body casing 2, a sheet feeding tray 7 on which sheets 4 to be formed with images are loaded in a manner enabling it to be drawn forward. Inside the sheet feeding tray 7, a sheet pressing plate 9 capable of tilting so as to lift the leading end side of the sheets 4 by means of urging of a spring 8 is provided. At the front end upper position of the sheet feeding tray 7, a pickup roller 10 and a separating pad 11 which comes into pressure contact with the pickup roller 10 due to urging of a spring (not shown) are provided. On a diagonally upper front side of the pickup roller 10, a pair of feed rollers 12 is provided, and above the feed rollers, a pair of resist rollers 13 is provided.

The uppermost sheets 4 in the sheet feeding tray 7 are pressed against the pickup roller 10 by the sheet pressing plate 9. When the sheets are sandwiched between the pickup roller 10 and the separating pad 11 due to rotation of the pickup roller 10, they are separated individually. Then, a sheet 4 fed-out from between the pickup roller 10 and the separating pad 11 is fed to the resist rollers 13 by the feed rollers 12. At the resist rollers 13, the sheet 4 is fed out to the position above a belt unit 15 on the rear side at a predetermined timing.

The belt unit 15 is detachably attached to the main body casing 2 and includes a conveying belt 18 which is laid horizontally across a pair of belt support rollers 16 and 17 arranged by being spaced in the front and rear direction. The conveying belt 18 is an endless belt made of a resin material such as polycarbonate. The conveying belt 18 circularly rotates counterclockwise in FIG. 1 according to rotation of the rear belt support roller 17 to convey the sheet 4 put on upper surface thereof rearward. On the inner side of the conveying belt 18, four transfer rollers 19 arranged so as to face photoconductor drums 31 serving as photoconductors of image forming units 26 described later are arranged at constant intervals in the front and rear direction so that the conveying belt 18 is sandwiched between the photoconductor drums 31 and corresponding transfer rollers 19. When transferring, a transfer bias is applied between the transfer roller 19 and the photoconductor drum 31.

Below the belt unit 15, a cleaning roller 21 for removing toner and sheet dust adhering to the conveying belt 18 is provided. The cleaning roller 21 is provided with a foamed material made of silicon around a shaft member made of a metal, and faces a metal-made backup roller 22 provided in the belt unit 15 so as to sandwich the conveying belt 18 between these. Between the cleaning roller 21 and the backup roller 22, a predetermined bias is applied, and thereby, toner and the like on the conveying belt 18 are electrically attracted to the cleaning roller 21 side. A metal-made collecting roller 23 for removing toner and the like adhering to the surface of the cleaning roller 21 is in contact with the collecting roller 23, and a blade 24 for scraping-off the toner and the like adhering to the surface of the collecting roller 23 is further in contact with the collecting roller 23.

To an upper portion inside the main body casing 2, a scanner unit 27 serving as a laser scanning device is provided. Below the scanner unit 27, a process unit 25 is provided, and below the process unit 25, the above-described belt unit 15 is arranged.

The scanner unit 27 irradiates a laser beam L of each color based on an image data onto the surface of the corresponding photoconductor drum 31 by means of high-speed scanning. The configuration of the scanner unit 27 will be described in detail later.

The process unit 25 includes four image forming units 26 for the colors of black (K), cyan (C), magenta (M), and yellow (Y), and these image forming units 26 are arranged in the front and rear direction. In this embodiment, from the front face side of the laser printer 1, image forming units 26 are arranged in the order of black, cyan, magenta, and yellow. Each image forming unit 26 includes a photoconductor drum 31 as an image carrier, a scorotron type charger 32, a developing cartridge 34 as a developing device, and so on. The process unit 25 includes a frame 29 having four cartridge fitting portions 30 arranged in the front and rear direction. Each cartridge fitting portion 30 is opened vertically, and each developing cartridge 34 is detachably fitted to the inside of the cartridge fitting portion 30. On the frame 29, the photoconductor drums 31 of the respective image forming units 26 are held at lower end positions of the cartridge fitting portions 30. The scorotron type chargers 32 are held adjacent to the photoconductor drums 31.

The photoconductor drum 31 has a metal-made drum main body which is grounded, and surface layer thereof is coated by a positively chargeable photosensitive layer made of polycarbonate. The scorotron type charger 32 is arranged to face the photoconductor drum 31 on the diagonally upper rear side of the photoconductor drum 31 at a predetermined distance from the photoconductor drum 31 so as not to come into contact therewith. This scorotron type charger 32 evenly positively charges the surface of the photoconductor drum 31 by generating corona discharge from a charging wire (not shown) made of tungsten or the like.

The developing cartridge 34 is formed into substantially a box shape and includes a toner containing chamber 38 at an upper portion, and below this, a supply roller 39, a developing roller 40, and a layer thickness regulating blade 41 below the toner containing chamber 38. In each toner containing chamber 38, a positively chargeable nonmagnetic one-component toner in each color of black, cyan, magenta, or yellow is contained as a developer. In each toner containing chamber 38, an agitator 42 for agitating the toner is provided.

The supply roller 39 is formed by coating a metal-made roller shaft by a conductive foamed material, and the developing roller 40 is formed by coating a metal-made roller shaft by a conductive rubber material. Toners discharged from the toner containing chambers 38 are supplied to the developing rollers 40 according to rotation of the supply rollers 39 and positively frictionally charged between the supply rollers 38 and the developing rollers 40. Furthermore, toners supplied onto the developing rollers 40 enter between the layer thickness regulating blades 41 and the developing rollers 40 according to rotation of the developing rollers 40 and are further frictionally charged there, and then carried onto the developing rollers 40 as thin layers with a constant thickness.

The surfaces of the photoconductor drums 31 are evenly positively charged by the scorotron type chargers 32 first when they rotate. Thereafter, the photoconductor drums 31 are exposed by high-speed scanning of a laser beam from the scanner unit 27, whereby electrostatic latent images corresponding to an image to be formed on the sheet 4 are formed.

Next, due to rotation of the developing rollers 40, when the toners which are carried on the developing roller 40 and positively charged face and come into contact with the photoconductor drums 31, the toners are supplied to the electrostatic latent images formed on the surfaces of the photoconductor drums 31. Thereby, the electrostatic latent images of the photoconductor drums 31 are visualized and toner images formed by the toners adhering thereto are carried on only the exposed portions of the surfaces of the photoconductor drums 31.

Thereafter, the toner images carried on the surfaces of the respective photoconductor drums 31 are successively transferred onto the sheet 4 due to a negative-polarity transfer bias applied to the transfer rollers 19 while the sheet 4 conveyed by the conveying belt 18 passes through the respective transfer positions between the photoconductor drums 31 and the transfer rollers 19.

The fixing device 43 is arranged at the rear of the conveying belt 18 inside the main body casing 2. This fixing device 43 includes a heating roller 44 which has a heat source such as a halogen lamp and is driven to rotate, and a pressurizing roller 45 which is arranged below the heating roller 44 so as to face the heating roller 44 and pressurize the heating roller 44 and is rotated following the heating roller. In this fixing device 43, by heating the sheet 4 on which a four-color toner image is carried while conveying the sheet 4 by sandwiching it by the heating roller 44 and the pressurizing roller 45, the toner image is fixed onto the sheet 4. The sheet 4 onto which the toner image is thermally fixed is further conveyed by a conveying roller 46 arranged on the diagonally upper rear side of the fixing device 43, and ejected onto the sheet discharging tray 5 by an eject roller 47 provided at an upper portion of the main body casing 2.

(Configuration of Scanner Unit)

Figure 2:
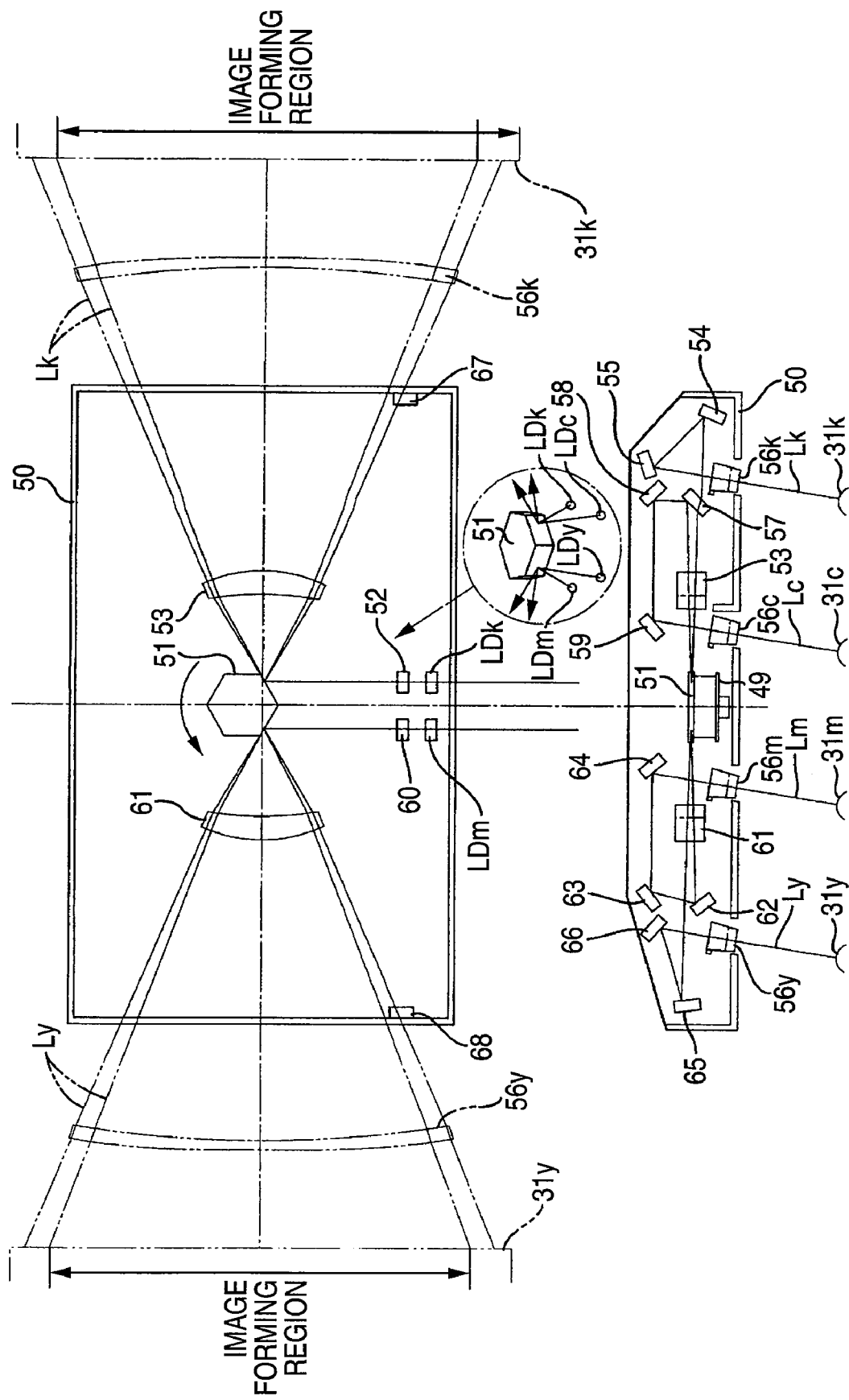
FIG. 2 is a schematic view for explaining a configuration of a scanner unit of the laser printer.

FIG. 2 is a schematic view for explaining the configuration of the scanner unit 27. In this drawing, the lower drawing shows a left side section of the scanner unit 27, and the upper drawing (reflecting mirrors are omitted) shows the inside of the scanner unit 27 from above. The right side in the drawing is the front face side of the laser printer 1, and the sheet 4 is conveyed from the right to the left of the drawing by the belt unit 15. That is, the leftward direction is the conveying direction of the sheet 4 in FIG. 2 and is a sub-scanning direction on the photoconductor drum 31. In the upper drawing of FIG. 2, regarding the laser beam Lk and the laser beam Ly, optical paths which are developed without being turned back by reflecting mirrors and optically equivalent to the lower drawing are shown.

As shown in FIG. 2, the scanner unit 27 includes a box-shaped resin-made housing 50, and at substantially the center of the inside thereof, for example, a polygon mirror 51 serving as a scanning unit having, for example, six faces to be driven by a polygon motor 49 is provided rotatably (driven to rotate counterclockwise in this drawing). In the housing 50, four laser light sources, more specifically, laser diodes LDk, LDc, LDm, and LDy as examples of the semiconductor lasers are provided near the polygon mirror 51 at right side in FIG. 2.

The laser diode LDk faces one deflecting face of the polygon mirror 51 positioned from a slightly upper side to a diagonally lower side, and emits a laser beam Lk modulated based on image data for black via a cylindrical lens 52. The laser beam Lk deflected by the polygon mirror 51 is guided to the front face side of the laser printer 1 and transmitted through a first scanning lens 53 (for example, fθ lens), turned rearward by a reflecting mirror 54, further turned downward by a reflecting mirror 55, transmitted through a second scanning lens 56k (for example, toric lens), and irradiated onto a surface of a photoconductor drum 31k of an image forming unit 26k for black. The laser beam Lk is scanned at a high speed from the left to the right (upward direction in the upper drawing: referred to as a first scanning direction, hereinafter) on the surface of the photoconductor drum 31k according to rotation of the polygon mirror 51.

The laser diode LDc is made to face one deflecting face (the same deflecting face as that for the laser diode LDk) of the polygon mirror 51 positioned from a lower position of the laser diode LDk to a diagonally upper side, and emits a laser beam Lc modulated based on image data for cyan via the cylindrical lens 52. The laser beam Lc is deflected by the same deflecting face as that for the laser beam Lk, guided to the front face side of the laser printer 1, transmitted through the first scanning lens 53, turned rearward by reflecting mirrors 57 and 58, and further turned downward by a reflecting mirror 59, transmitted through a second scanning lens 56c (for example, toric lens), and irradiated onto a surface of a photoconductor drum 31c of an image forming unit 26c for cyan. The laser beam Lc is scanned at a high speed along the first scanning direction on the surface of the photoconductor drum 31c according to rotation of the polygon mirror 51.

The laser diode LDm is arranged at the rear of the laser diode LDk while aligned with it, and made to face one deflecting face (adjacent to the deflecting face that the laser diodes LDk and LDc are made to face) of the polygon mirror 51 positioned from a slightly upper side to a diagonally lower side, and emits a laser beam Lm modulated based on image data for magenta via a cylindrical lens 60. The laser beam Lm deflected by the polygon mirror 51 is guided to the rear face side (substantially opposite to the direction of the laser beams Lk and Lc) of the laser printer 1, transmitted through a first scanning lens 61 (for example, fθ lens), turned forward by reflecting mirrors 62 and 63, further turned downward by a reflecting mirror 64, transmitted through a second scanning lens 56m (for example, toric lens), and irradiated onto a surface of a photoconductor drum 31m of an image forming unit 26m for magenta. Then, the laser beam Lm is scanned at a high speed from the right to the left (downward direction in the upper drawing: direction opposite to the scanning direction of the laser beams Lk and Lc: hereinafter, referred to as a second scanning direction) on the surface of the photoconductor drum 31m according to rotation of the polygon mirror 51.

The laser diode LDy is made to face one deflecting face (the same deflecting face as that for the laser diode LDm) of the polygon mirror 51 positioned from a lower side position of the laser diode LDm to a diagonally upper side, and emits a laser beam Ly modulated based on image data for yellow via the cylindrical lens 60. The laser beam Ly deflected by the polygon mirror 51 is guided to the rear face side of the laser printer 1, transmitted through the first scanning lens 61, turned forward by a reflecting mirror 65, further turned downward by a reflecting mirror 66, transmitted through a second scanning lens 56y (for example, toric lens), and irradiated onto a surface of a photoconductor drum 31y of an image forming unit 26y for yellow. Then, the laser beam Ly is scanned at a high speed along the second scanning direction on the surface of the photoconductor drum 31y according to rotation of the polygon mirror 51. The above-described first scanning lenses 53 and 61, second scanning lens 56, and reflecting mirrors 54, 55, 57 through 59, and 62 through 66 are supported and fixed inside the housing 50 of the scanner unit 27.

In the housing 50, at a left end of its front side inner wall face, a first Beam Detection (BD) sensor 67 (example of the origin detecting unit) is arranged, and at a left end of a rear side inner wall face, a second BD sensor 68 is arranged. The first BD sensor 67 is capable of receiving the laser beam Lk immediately before reaching the surface of the photoconductor drum 31k, and by taking this first light receiving timing as a reference, timings of scanning start of not only this laser beam Lk but also the laser beams Lc, Lm, and Ly on the respective photoconductor drums 31 (main scanning direction writing start timings) are determined. The second BD sensor 68 is capable of receiving the laser beam Ly immediately after being scanned on the surface of the photoconductor drum 31y.

(Configuration of Control System of Laser Printer)

Figure 3:
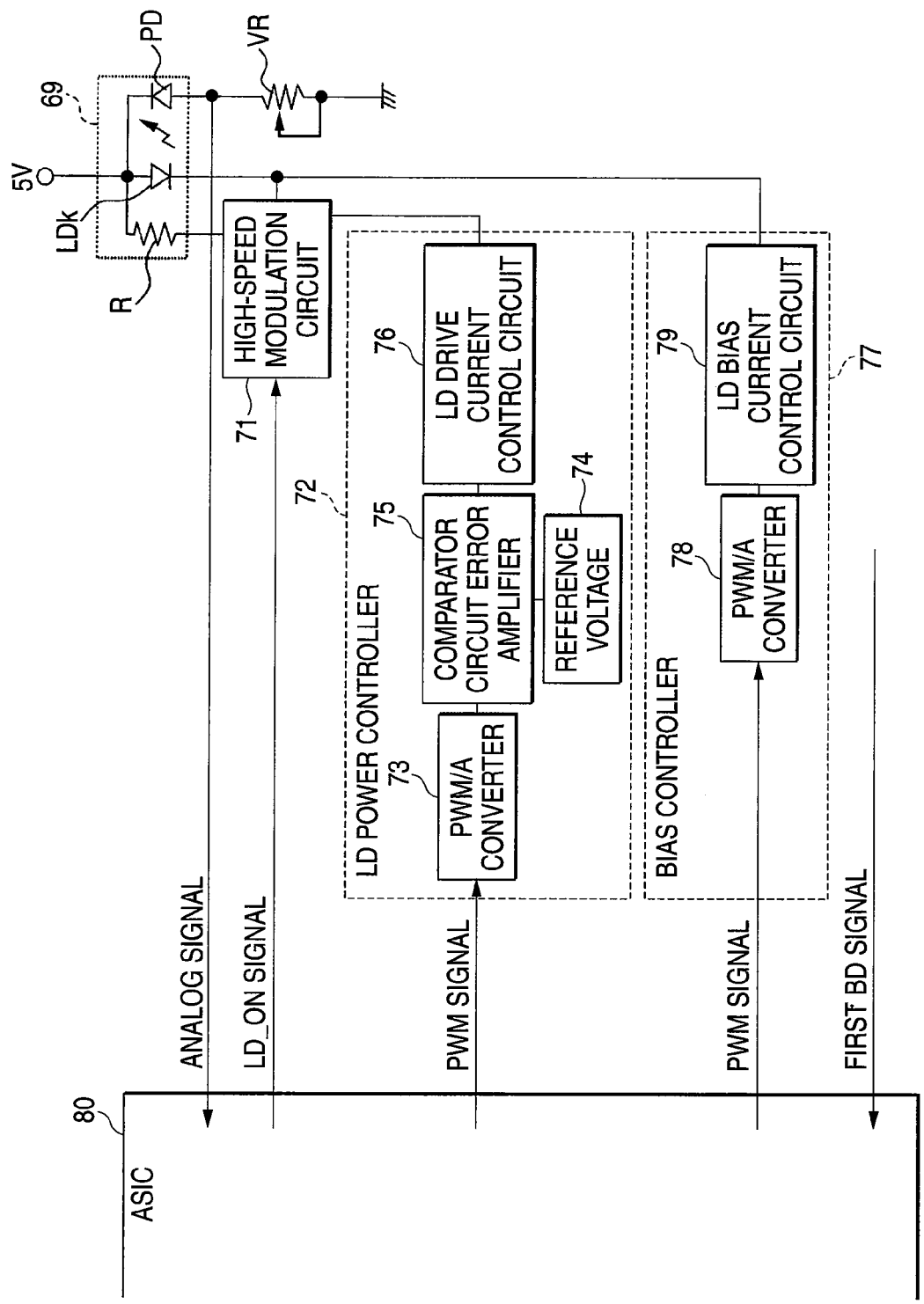
FIG. 3 is a block diagram showing a configuration of a control system of the scanner unit.

FIG. 3 is a block diagram showing a configuration of a control system of the laser diodes LDk, LDc, LDm, and LDy. The laser diodes LDk, LDc, LDm, and LDy are connected to ASIC 80 via similar circuits, respectively, so that only the circuit relating to the laser diode LDk is shown in FIG. 3 and other circuits are omitted.

As shown in FIG. 3, the laser diode LDk is housed in a laser diode unit 69 together with a photodiode PD (example of a light receiving element) for detecting a light amount generated by the laser diode LDk, and a resistor R described later.

The anode of the photodiode PD is connected to an A/D input port of the ASIC 80 and grounded via a variable resistor VR. The cathode of the photodiode PD is connected to a power source of 5V together with the anode of the laser diode LDk. Therefore, an anode voltage (hereinafter, referred to as a monitor voltage) of the photodiode PD changes according to the light amount of the laser diode LDk. Furthermore, to the cathode of the laser diode LDk, an LD power controller 72 as an example of the current controller is connected via a high-speed modulation circuit 71 as an example of the switching unit.

The LD power controller 72 includes a PWM/A converter 73 as an example of the monitor value generating unit which converts a PWM signal inputted from the ASIC 80 into an analog voltage, a comparator circuit error amplifier 75 as an example of the comparing controller which amplifies a difference between a voltage outputted from the PWM/A converter 73 and a reference voltage (reference value) set by a reference voltage setting unit 74 by a predetermined gain, and an LD drive current control circuit 76 which controls a drive current to be supplied to the laser diode LDk according to an output of the comparator circuit error amplifier 75.

The high-speed modulation circuit 71 switches, according to an LD_on signal inputted from the ASIC 80, between connection of the LD power controller 72 to the cathode of the laser diode LDk and connection of the LD power controller 72 to the anode of the laser diode LDk via a resistor R. Therefore, when the LD_on signal goes H and the high-speed modulation circuit 71 connects the LD power controller 72 to the cathode of the laser diode LDk, the drive current flows into the laser diode LDk and the laser diode LDk emits light. When the LD_on signal goes L and the high-speed modulation circuit 71 connects the LD power controller 72 to the resistor R, the drive current is drawn into an energizing path passing through the resistor R and the laser diode LDk is turned off. The LD_on signal goes H not only at timing corresponding to image data but also at a predetermined time at which a laser beam Lk does not reach the photoconductor drum 31k although the laser beam is emitted by the laser diode LDk. Based on the monitor voltage detected at this time, the drive current is controlled as described later.

To the cathode of the laser diode LDk, a bias controller 77 is connected parallel to the high-speed modulation circuit 71 and the LD power controller 72. This bias controller 77 includes a PWM/A converter 78 which converts a PWM signal inputted from the ASIC 80 into an analog voltage and an LD bias current control circuit 79 which controls a bias current to be supplied to the laser diode LDk according to a voltage outputted from the PWM/A converter 78. Furthermore, into the ASIC 80, a first BD signal as a detection signal of the first BD sensor 67 is inputted.

The ASIC 80 gradually increases a current to be supplied to the laser diode LDk via the bias controller 77 when the laser diode LDk is turned off (when the LD_on signal is L), and detects an energizing current (hereinafter, referred to as a bias current) at a level at which the laser diode LDk does not generate a laser beam Lk (oscillation light). Then, by energization with the detected bias current via the bias controller 77 when the laser diode LDk is turned off, the responsiveness of the laser diode LDk to the LD_on signal is improved.

Figure 4:
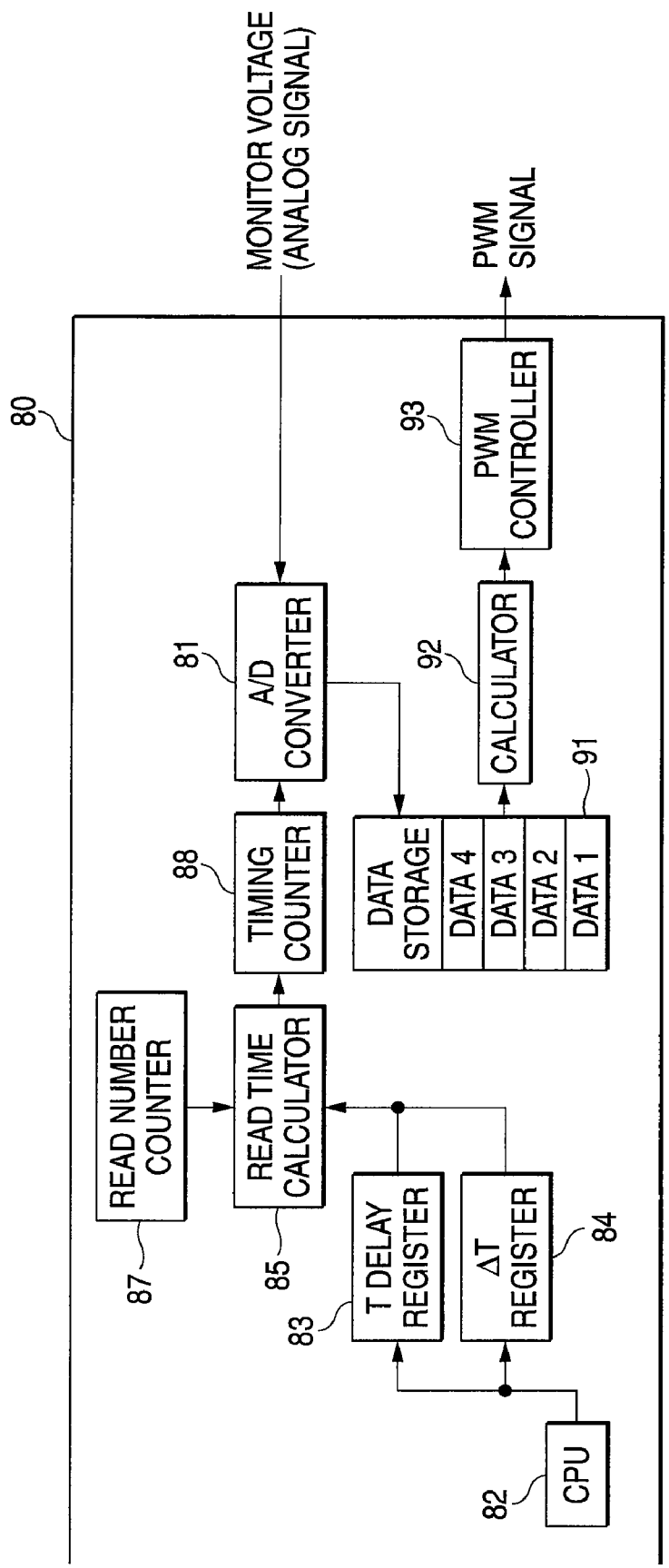
FIG. 4 is a block diagram showing a configuration of ASIC of the control system.

FIG. 4 is a block diagram showing an internal configuration of the ASIC 80 relating to control of the drive current for the laser diode LDk. As shown in FIG. 4, the ASIC 80 includes an A/D converter 81 which reads the monitor voltage inputted as an analog signal (ANALOG signal) at a timing regulated by the following configuration and converts the analog signal into digital data (digital signal).

As shown in FIG. 4, the ASIC 80 includes $T_{delay}$ register 83 and $\Delta T$ register 84 that respectively store two parameters $T_{delay}$ and $\Delta T$ that can be arbitrarily set by the CPU 82. The parameters stored in the $T_{delay}$ register 83 and $\Delta T$ register 84 are inputted into a read time calculator 85 together with a signal from the read number counter 87. The read number counter 87 cyclically counts the number of times of reading (hereinafter, referred to as a read number N) the monitor voltage by the A/D converter 81 in a range of 0 to 3, for example, 0, 1, 2, 3, 0, 1, ... and so on. The read time calculator 85 calculates a read time by the equation of $T_{delay} + N \times \Delta T$ and inputs the result into a timing counter 88. Then, the timing counter 88 inputs a signal into the A/D converter 81 at a timing of elapse of the read time since the LD_on signal goes H. According to this input, the A/D converter 81 reads the monitor voltage and converts the monitor voltage into digital data.

The digital data converted by the A/D converter 81 is stored in a data storage 91 as an example of a storage. The data storage 91 stores four digital data of DATA 4, DATA 3, DATA 2, and DATA 1 in order from the newest one. A calculator 92 as an example of the average calculating unit connected to the data storage 91 calculates a control value as described below and inputs the calculated control value into a PWM controller 93 based on digital data stored in the data storage 91. The PWM controller 93 inputs a PWM signal corresponding to the control value into the PWM/A converter 73 (see FIG. 3) of the LD power controller 72.

(Operation and Effect of Control System)

Figure 5:
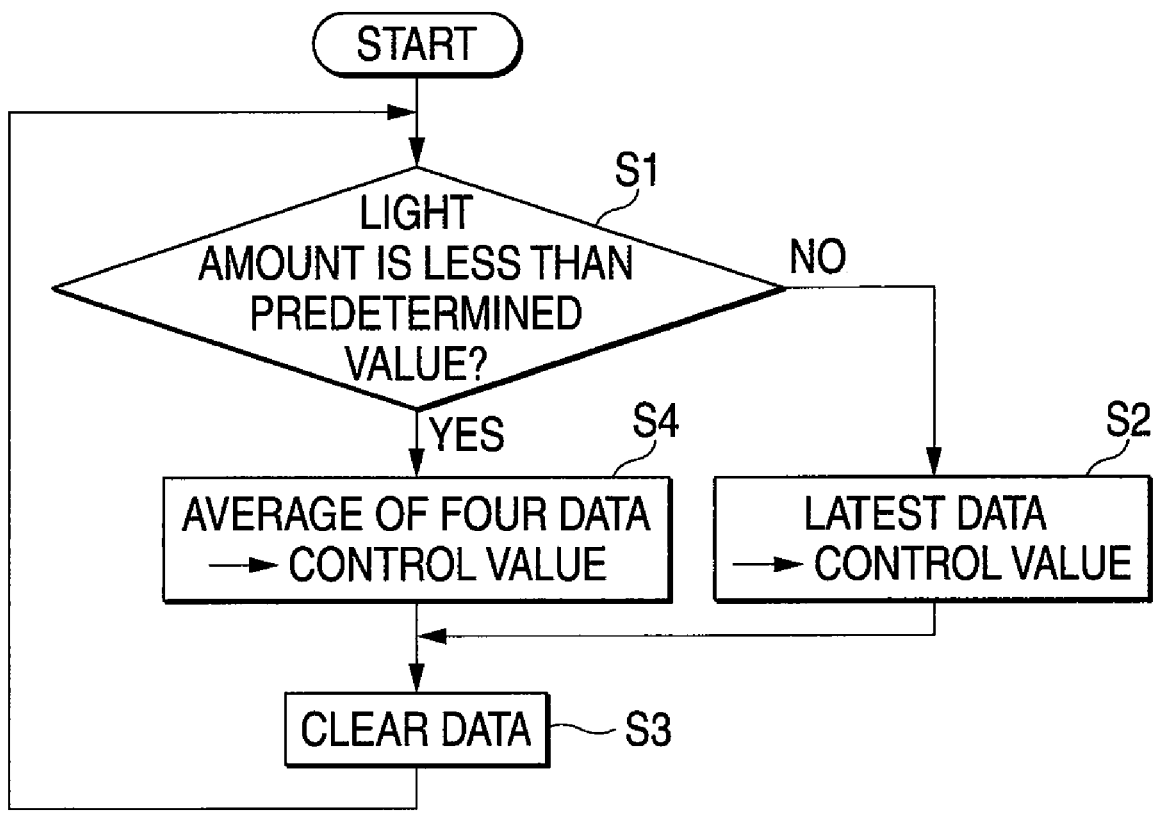
FIG. 5 is a flowchart showing calculation processing of a calculator of the ASIC.

Calculation to be executed in the calculator 92 will be described. The calculator 92 is configured as a microcomputer including a CPU, a ROM, and a RAM, and executes the following calculation processing since the drive current start flowing to the laser diode LDk. FIG. 5 is a flowchart showing calculation processing to be executed in the calculator 92.

As shown in FIG. 5, when the processing starts, at S1 (S indicates step, the same applies to the following description), based on the latest data stored in the data storage 91, it is determined whether the light amount of the laser diode LDk is not less than a predetermined value. This predetermined value may be a target value of the light amount, or a value defined by the target value, for example, 80% of the target value or a value slightly lower than the target value. The first BD sensor 67 cannot detect a laser beam Lk if the light amount of the laser beam Lk is not less than a certain value. Therefore, at S1, the determination may be made based on whether the first BD sensor 67 has detected the laser beam Lk of the laser diode LDk.

At the time such as the time immediately after the drive current of the laser diode LDk starts flowing, the light amount has not reached the predetermined value (S1: N), so that the process transfers to S2, and the latest data stored in the data storage 91 is inputted as a control value into the PWM controller 93. At the next S3, data stored in the data storage 91 is cleared and the process transfers to the above-described S1.

On the other hand, when the light amount reaches the predetermined value (S1:Y), at S4, an average of the four data stored in the data storage 91 is inputted as a control value into the PWM controller 93, and the process transfers to the above-described S3. When the data is cleared at S3, even if the process transfers to S2 or S4 immediately after this, one or four data are not stored in the data storage 91 in some cases. In this case, the process waits at S2 or S4 until a necessary number of data are stored in the data storage 91.

Therefore, in this embodiment, when the light amount is less than the predetermined value (S1: N), the latest data (a digital value of the monitor voltage) stored in the data storage 91 is set as a control value and inputted into the PWM controller 93. Then, the LD power controller 72 controls the drive current of the laser diode LDk so that the monitor value (output of the PWM/A converter 73) corresponding to the control value approaches the reference value. Thus, in this embodiment, in the case where the light amount of the laser diode LDk is less than the predetermined value such as the time immediately after the drive current to the laser diode LDk starts flowing (S1: N), based on the latest data stored in the data storage 91, the drive current is controlled at every timing of reading latest one data (referring number). Therefore, the following capability of the control of the drive current to the light amount changes can be improved and the light amount can be made to quickly reach the target value.

Figure 6:
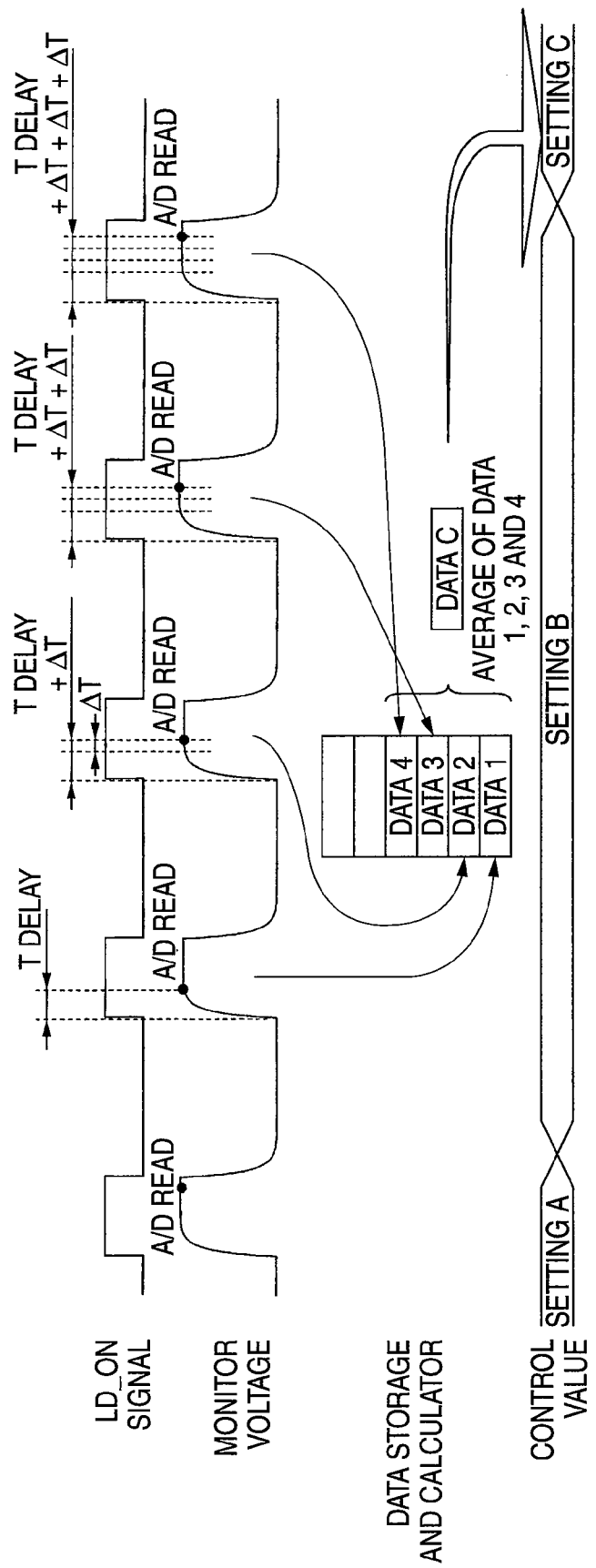
FIG. 6 is a time chart showing the calculation processing.

In addition, in this embodiment, when the light amount is not less than the predetermined value (S1: Y), an average of the four data stored in the data storage 91 is set as a control value. Therefore, the time after the light amount reaches the target value, stable control can be performed. In addition, in this case, as schematically shown in FIG. 6, the control value is changed at each timing of reading of four data (referring number), so that more stable control can be performed. In other words, the driver current is controlled once in each time period. A time period when the light amount of the laser diode LDk dose not reach the predetermined value such as the time immediately after the drive current is increased to a time period when the light amount of the laser diode LDk reaches the predetermined value.

Figure 7A:
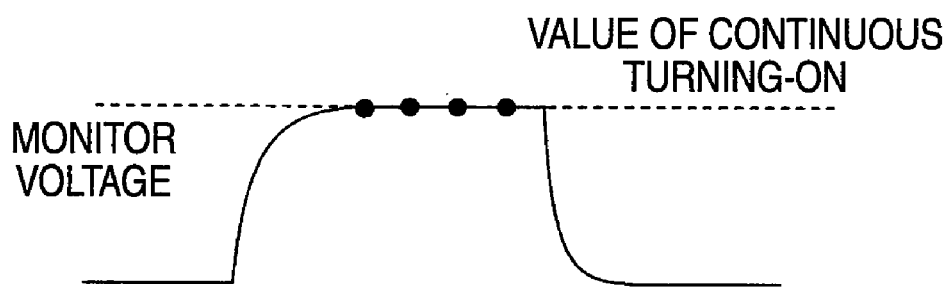
FIGS. 7A to 7C are explanatory views showing an effect of the calculation processing.
Figure 7B:
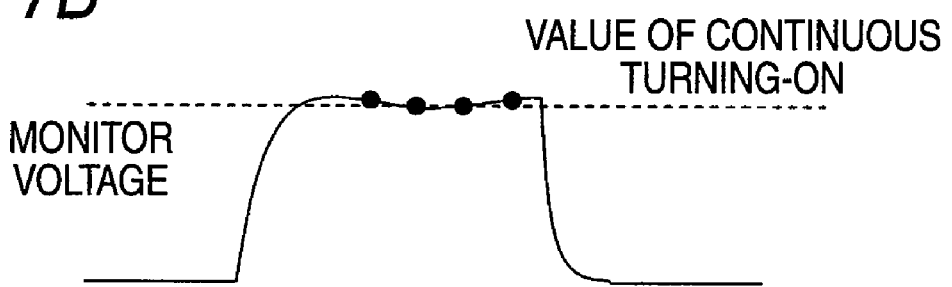
Figure 7C:
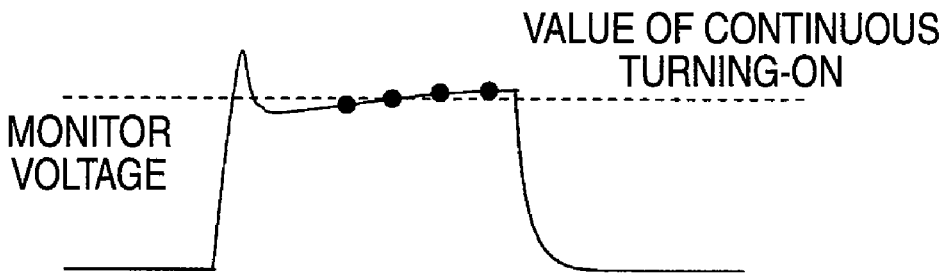

Furthermore, in this case, as schematically shown in FIG. 6, the four data are read while the read time is shifted by $\Delta T$ one after another. Therefore, in this embodiment, the following effect is further obtained. That is, as illustrated in FIG. 7A, after the laser diode LDk is turned on, there is no problem if the monitor voltage (corresponding to the light amount of the laser diode LDk) is immediately settled to the value in case of the laser diode LDk turned-on continuously. However, as shown in FIGS. 7B and 7C, fluctuation such as overshoot often occurs in the monitor voltage. Therefore, if the read time is fixed, errors may be reflected such that the data are always read at the timing of overshoot. On the other hand, in the present embodiment, as illustrated in FIG. 7A to 7C, data are read at the four timings from each of the start of drive current flowing, so that the light amount can be satisfactorily controlled to the target value while the influence of the fluctuation can be dispersed.

In the example of FIG. 6, the read time of data stored in the data storage 91 changes in order of $T_{delay}$, $T_{delay}+\Delta T$, $T_{delay}+\Delta T+\Delta T$, and $T_{delay}+\Delta T+\Delta T+\Delta T$. However, various changes are allowed such as changes in order of $T_{delay}+\Delta T+\Delta T+\Delta T$, $T_{delay}$, $T_{delay}+\Delta T$, $T_{delay}+\Delta T+\Delta T$. In the above-described embodiment, after calculating the control value, the data in the data storage 91 are cleared (S3). However, the data of the data storage 91 may be updated in order from the oldest one. In this case, when the average of the four data is set as the control value (S4), the control value is calculated when the data in the data storage 91 are all updated. Furthermore, not only when the drive current of the laser diode LDk starts flowing, the control of this embodiment may be performed similarly also when the target value of the light amount is changed. Also in this case, the light amount can be made to quickly reach the changed target value, and after reaching, stable control can be performed. The description given above is about the laser diode LDk, however, other laser diodes LDc, LDm, and LDy are also controlled similarly.

In the present embodiment described above, the ASIC 80 and LD power controller 72 correspond to the controller, the photodiode PD, the variable resistor VR, and the A/D comparator 81 correspond to the light amount detecting unit, and the configuration from the laser diode unit 69 to the ASIC 80 corresponds to the optical control device.

Figure 8:
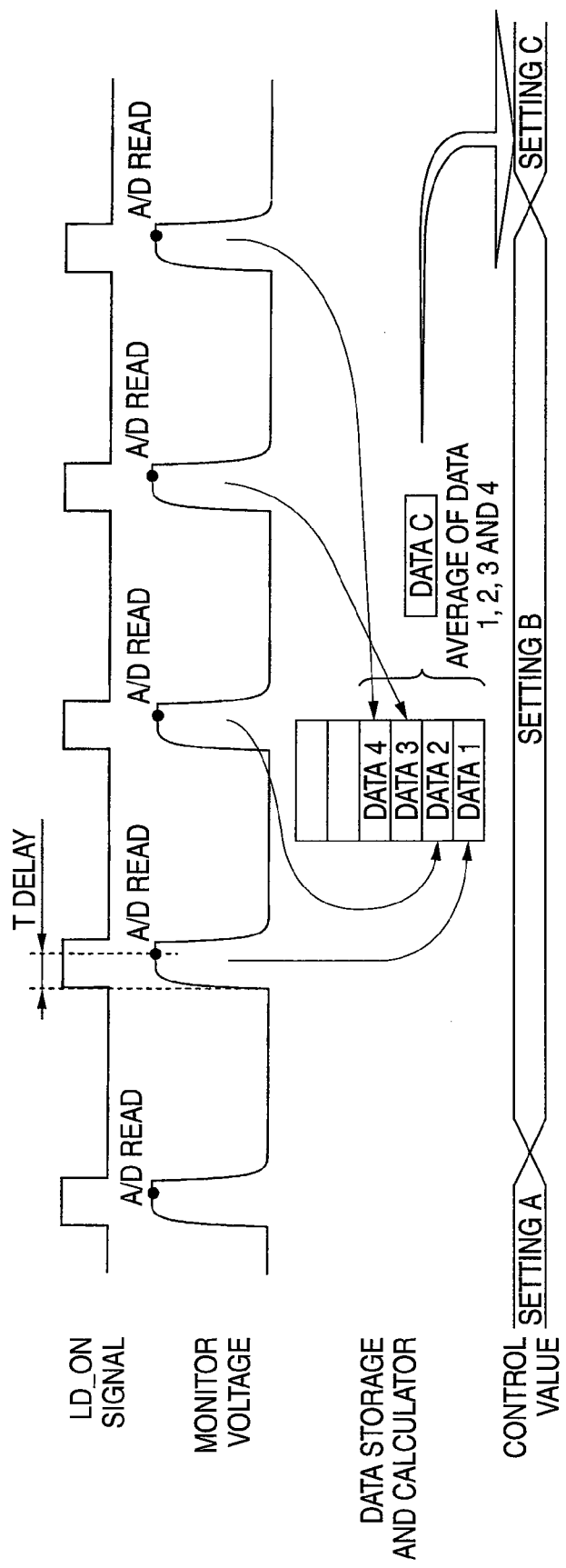
FIG. 8 is a time chart showing a variation of the calculation processing.
Figure 9:
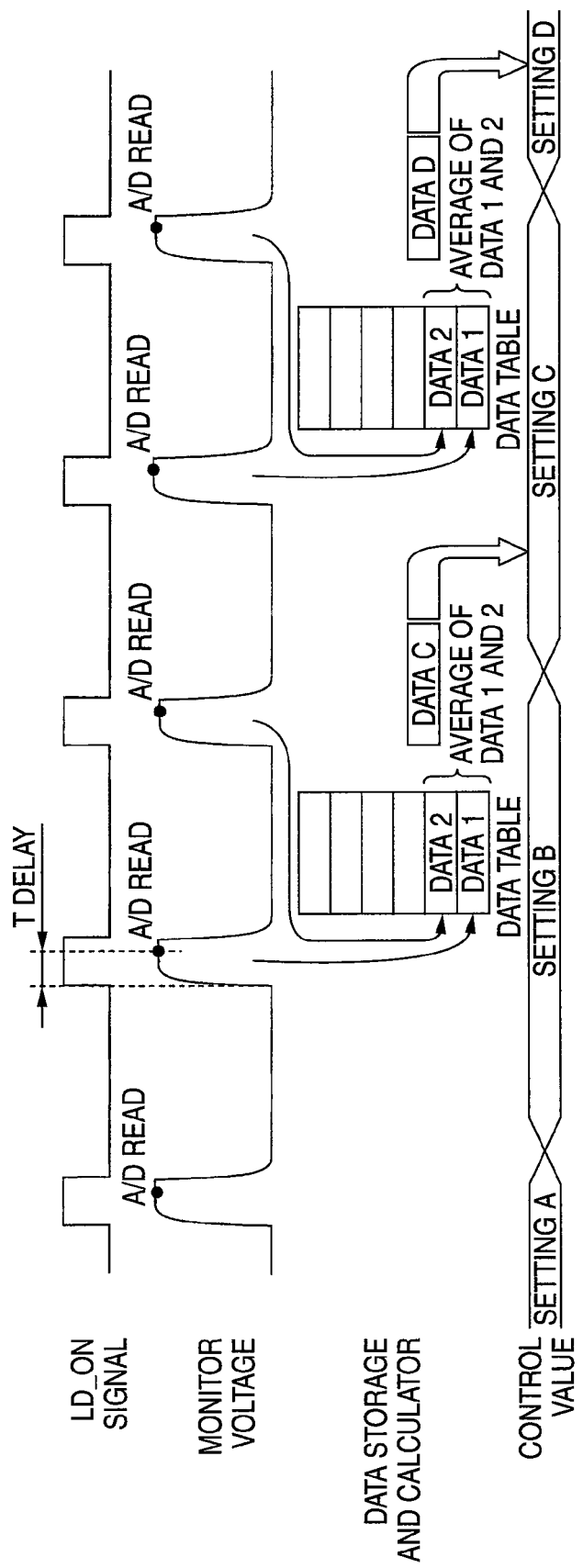
FIG. 9 is a time chart showing another variation of the calculation processing.

The present invention is not limited to the above-described embodiment at all, and may be carried out in various ways without deviating from the spirit of the present invention. For example, as illustrated in FIG. 8, the read time may be fixed to $T_{delay}$. When setting an average of a plurality of data stored in the data storage 91 as a control value, the number of data to be referred to may be two as illustrated in FIG. 9, or may be another number. Furthermore, by substantially increasing the number of data to be referred to in three or more stages as the light amount approaches the target value, both of quick reach of the light amount to the target value and stable control after the light amount reaches the target value can be more satisfactorily realized. Furthermore, in the above-described embodiment, an average of a plurality of data is set as a control value, however, a median of the plurality of data may be set as the control value, or an average calculated upon excluding data extremely different from other data may be set as the control value. In addition, the number of data to be referred to when the drive current of the laser diode starts flowing may be two or more as long as the number is smaller than the number of data to be referred to when the light amount reaches the predetermined values.

Furthermore, processings to be executed in the ASIC 80, the LD power controller 72, and the like of the above-described embodiment may be all executed by means of software. Furthermore, the present invention may be also applicable to various optical control devices other than laser printers.

The switching timing of the number of times of detection of the light amount that the controller refers to at a time may not be the time of reaching of the light amount to the target value, and may be set to an appropriate timing in a range from a time when the drive current starts flowing to the time immediately after the light amount reaches the target value.

The number of times of detection of the light amounts that the controller refers to at a time can be arbitrarily set, however, the number of times of detection of the light amounts that the controller refers to at a time when the drive current starts flowing may be one. In this case, only one result of light amount detection is referred to for one time of control when the drive current starts flowing, so that light amount changes when the drive current starts flowing can be satisfactorily followed.

The light amount detecting unit may include a light receiving element which has an electric characteristic responsive to a received light amount and an A/D converter that converts an analog signal corresponding to the electric characteristics of the light receiving element into a digital signal. In this case, the electric characteristic of the light receiving element responsive to the light amount are converted into a digital signal by the A/D converter, so that when the controller is constituted by a microcomputer or the like, the configuration of the whole optical control device can be simplified. The electric characteristic may be an appropriate parameter such as a current value, a voltage value, and a resistance value.

The controller may include a storage that stores light amounts detected a plurality of times by the light amount detecting unit, an average calculating unit that calculates an average of light amounts stored in the storage, and a current controller that controls the drive current based on the average calculated by the average calculating unit, and the number of light amounts to be averaged by the average calculating unit may be smaller at least at the time when the drive current start flowing than after the light amount reaches a predetermined value.

In this case, the storage is capable of storing light amounts detected a plurality of times by the light amount detecting unit, and the calculating unit calculates an average of the light amounts stored in the storage. The current controller controls the drive current based on the average calculated by the average calculating unit. Herein, the number of light amounts to be averaged by the average calculating unit is smaller at least at the time when the drive current starts flowing than after the light amount reaches the target value.

Therefore, in this case, as described above, the number of times of detection of the light amounts that the controller refers to at a time can be easily made smaller at least at the time when the drive currents starts flowing than after the light amount reaches the target value. As a method for thus changing the number of light amounts to be averaged by the average calculating unit, the number of light amounts to be stored in the storage may be changed, or the number of light amounts to be used for averaging among the light amounts stored in the storage may be changed.

The current controller in this case may include a monitor value generating unit that generates a monitor value based on an average calculated by the average calculating unit and a comparing controller that controls the drive current so that the monitor value approaches a preset reference value by comparing the monitor value and the reference value.

The optical control device may further include switching unit that switches between a first state where the drive current flows to the semiconductor laser and a second state where the drive current flows to a energizing path which does not pass through the semiconductor laser, according to a signal. The controller refers to detection results of the light amount after a detection time period since the switching unit switches to the first state from the second state, while the detection time period being varied.

In this case, even if fluctuation such as overshoot occurs in the light amount immediately after the drive current starts flowing into the semiconductor laser by the switching unit, the interval (predetermined time) from the flowing-in of the drive current to detection of the light amount is changed as appropriate. Therefore, in this case, the influence from the light amount fluctuation can be dispersed, and even without a long period of emission from the semiconductor laser, the light amount of the laser beam may be satisfactorily controlled to the target value. The predetermined time may be arbitrarily set in advance in the optical control device.

An optical control device may includes a semiconductor laser that generates a light according to a drive current; a light amount detecting unit that detects a light amount of the light generated by the semiconductor laser; a controller that controls the drive current to adjust the light amount to a target value by referring to the detection result of the light amount by the light amount detecting unit; and a switching unit that switches between a first state where the drive current flows to the semiconductor laser and a second state where the drive current flows to a energizing path which does not pass through the semiconductor laser, according to a signal. The controller refers to detection results of the light amount after a detection time period since the switching unit switches to the first state from the second state, while the detection time period being varied.

According to the configuration, by referring to a light amount of a laser beam detected by the light amount detecting unit, the controller controls the drive current of the semiconductor laser so that the light amount approaches a target value. In addition, the interval (predetermined time) from the flowing-in of the drive current into the semiconductor laser by the switching unit to detection of the light amount is changed as appropriate. Therefore, even when fluctuation such as overshoot occurs in the light amount immediately after the drive current starts flowing into the semiconductor laser by the switching unit, influence from the fluctuation can be dispersed. Therefore, even without a long period of emission from the semiconductor laser, the light amount of the laser beam can be satisfactorily controlled to the target value. The above-described predetermined time can be arbitrarily set in advance in the optical control device.

What is claimed is:

1. An optical control device comprising:
   a semiconductor laser that generates a light according to a drive current;
   a light amount detecting unit that detects an amount of light generated by the semiconductor laser; and
   a controller that controls the drive current to adjust the amount of light toward a target value by using a control value that is calculated using at least one detection result from the light amount detecting unit,
   wherein a first number of detection results used in calculating one control value at a time when the controller starts the drive current flowing is smaller than a second number of detection results used in calculating one control value after the detection result of the amount of light reaches a predetermined value.

2. The optical control device according to claim 1, wherein the first number of detection results used in calculating one control value at the time when the controller starts the drive current flowing is one.

3. The optical control device according to claim 1, wherein the light amount detecting unit includes:
   a light receiving element that has an electric characteristic responsive to a received light amount and outputs an analog signal corresponding to the electric characteristic; and
   an A/D converter that converts the analog signal from the light receiving element into a digital signal.

4. The optical control device according to claim 1, wherein the controller includes:
   a storage that stores a plurality of detection results from the light amount detecting unit;
   an average calculating unit that calculates an average of a number of detection results of the light amount stored in the storage; and
   a current controller that controls the drive current based on the average calculated by the average calculating unit,
   wherein a third number of detection results for calculating the average of the detection results at the time when the controller starts the drive current flowing is smaller than a fourth number of detection results for calculating the average of the detection results after the detection result of the amount of light reaches the predetermined value.

5. The optical control device according to claim 4, wherein the current controller includes:
   a monitor value generating unit that generates a monitor value based on the average calculated by the average calculating unit; and a comparing controller that controls the drive current to adjust the monitor value to a preset reference value by comparing the monitor value and the reference value.

6. The optical control device according to claim 1, wherein a third number of detection results used in calculating one control value during a time period from the time when the controller starts the drive current flowing and a time when the detection result of the amount of light reaches the predetermined value is smaller than a fourth number of detection results used in calculating one control value after the detection result of the amount of light reaches the predetermined value.

7. The optical control device according to claim 1, wherein the predetermined value is equal to the target value.

8. The optical control device according to claim 1, wherein the predetermined value is less than the target value.

9. An optical control device comprising:
a semiconductor laser that generates a light according to a drive current;
a light amount detecting unit that detects an amount of light generated by the semiconductor laser; and
a controller that controls the drive current to adjust the amount of light to a target value and includes:
a storage that stores a plurality of detection results from the light amount detecting unit;
an average calculating unit that calculates an average of a number of detection results of the amount of light stored in the storage; and
a current controller that controls the drive current based on the average calculated by the average calculating unit,
wherein a first number of detection results for calculating the average of the detection results at the time when the controller starts the drive current flowing is smaller than a second number of detection results for calculating the average of the detection results after the detection result of the amount of light reaches the predetermined value.

10. The optical control device according to claim 9, wherein the current controller includes:
a monitor value generating unit that generates a monitor value based on the average calculated by the average calculating unit; and
a comparing controller that controls the drive current to adjust the monitor value to a preset reference value by comparing the monitor value and the reference value.

11. The optical device according to claim 1,
wherein the light amount detecting unit detects the amount of light once in a predetermined time period.

12. The optical device according to claim 1,
wherein the controller further includes:
a storage that stores a plurality of detection results from the light amount detecting unit;
a current controller that controls the drive current based on the detection results stored in storage;
wherein a third number of detection results that the current controller uses between the time when the controller starts the drive current flowing and the time when the detection result of the amount of light reaches the predetermined value is smaller than the fourth number of detection results that the current controller uses after the detection result of the amount of light reaches the predetermined value.

13. The optical control device according to claim 1, further comprising:
a switching unit that switches between a first state where the drive current flows to the semiconductor laser and a second state where the drive current flows to a energizing path which does not pass through the semiconductor laser, according to a signal,
wherein the controller refers to detection results of the light amount detected after a detection time period since the switching unit switches to the first state from the second state, while the detection time period being varied.

* * * * *